(12) United States Patent
Yang et al.

(10) Patent No.: US 8,267,159 B2
(45) Date of Patent: Sep. 18, 2012

(54) THERMAL MODULE

(75) Inventors: Jian Yang, Shenzhen (CN); Jing Zhang, Shenzhen (CN)

(73) Assignees: Fu Zhun Precision Industry (ShenZhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 418 days.

(21) Appl. No.: 12/758,740

(22) Filed: Apr. 12, 2010

(65) Prior Publication Data

US 2011/0186269 A1 Aug. 4, 2011

(51) Int. Cl.
*F28F 7/00* (2006.01)
*H05K 7/20* (2006.01)
(52) U.S. Cl. .............. 165/80.3; 165/104.34; 165/104.21
(58) Field of Classification Search .................. 165/80.2, 165/80.3, 104.21, 104.34, 121; 361/679.48, 361/679.47, 679.52, 679.54, 697, 694, 700, 361/703; 257/715
See application file for complete search history.

(56) References Cited

U.S. PATENT DOCUMENTS

| 7,254,023 | B2* | 8/2007 | Lu et al. ......................... 361/698 |
| 2005/0073811 | A1* | 4/2005 | Wang et al. .................... 361/688 |
| 2006/0056153 | A1* | 3/2006 | Lopatinsky et al. .......... 361/697 |
| 2007/0097643 | A1* | 5/2007 | Cheng ............................ 361/700 |
| 2007/0251675 | A1* | 11/2007 | Hwang et al. ............. 165/104.33 |
| 2008/0087407 | A1* | 4/2008 | Yang ......................... 165/104.33 |
| 2008/0156460 | A1* | 7/2008 | Hwang et al. ................ 165/80.3 |
| 2008/0251237 | A1* | 10/2008 | Hung ............................ 165/80.3 |
| 2011/0100600 | A1* | 5/2011 | Tang et al. ...................... 165/96 |
| 2011/0240258 | A1* | 10/2011 | Yang et al. ....................... 165/67 |

* cited by examiner

*Primary Examiner* — Tho V Duong
(74) *Attorney, Agent, or Firm* — Altis Law Group, Inc.

(57) ABSTRACT

An exemplary thermal module includes a heat absorbing member, a heat sink, a heat conducting member connecting the heat absorbing member with the heat sink, and centrifugal fan. The heat absorbing member has four fixing portions for fixing the thermal module. The heat sink includes a base and a fin assembly disposed on the base. The centrifugal fan includes a housing defining a lateral air outlet therein and an impeller rotatably received in the housing. The housing engages with the engaging portion and is detachably mounted to the heat absorbing member, with the air outlet facing the fin assembly. One of the fixing portions of heat absorbing member is shaded by the housing. The housing and the engaging portion cooperatively provide a sliding mechanism therebetween to allow the centrifugal blower to be slidable relative to the base after the lateral side of the housing detached from the heat absorbing member.

20 Claims, 8 Drawing Sheets

THERMAL MODULE

BACKGROUND

1. Technical Field

The disclosure generally relates to thermal modules; and more particularly to a thermal module which can be assembled to a heat generating component easily.

2. Description of Related Art

With the continuing development of electronics technology, electronic components of electronic devices, such as central processing units (CPUs), memory modules, and video graphics array (VGA) chips, generate much heat in operation. The heat needs to be dissipated efficiently to ensure the continued proper functioning of the electronic device.

Generally, a thermal module is provided to dissipate heat of the electronic component. The thermal module includes a fixing plate, a centrifugal blower arranged on the fixing plate, a heat sink arranged at an air outlet of the centrifugal blower, and a heat pipe for transferring heat of the electronic component to the heat sink. The fixing plate defines a plurality of mounting holes therein. Screws are extended through the mounting holes to attach the thermal module to the electronic component.

Typically, the thermal module is fully assembled for the purposes of packaging or transportation. Thus, in the case of a compact thermal module, several of the mounting holes of the fixing plate may be covered by the centrifugal blower. Later on, when the thermal module is attached to an electronic component, the centrifugal blower must be detached from the fixing plate to expose the mounting holes, and then attached again to the fixing plate after the fixing plate is fixed to the electronic component. Such detaching and reattaching is inconvenient.

What is needed, therefore, is a thermal module to overcome the above-described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
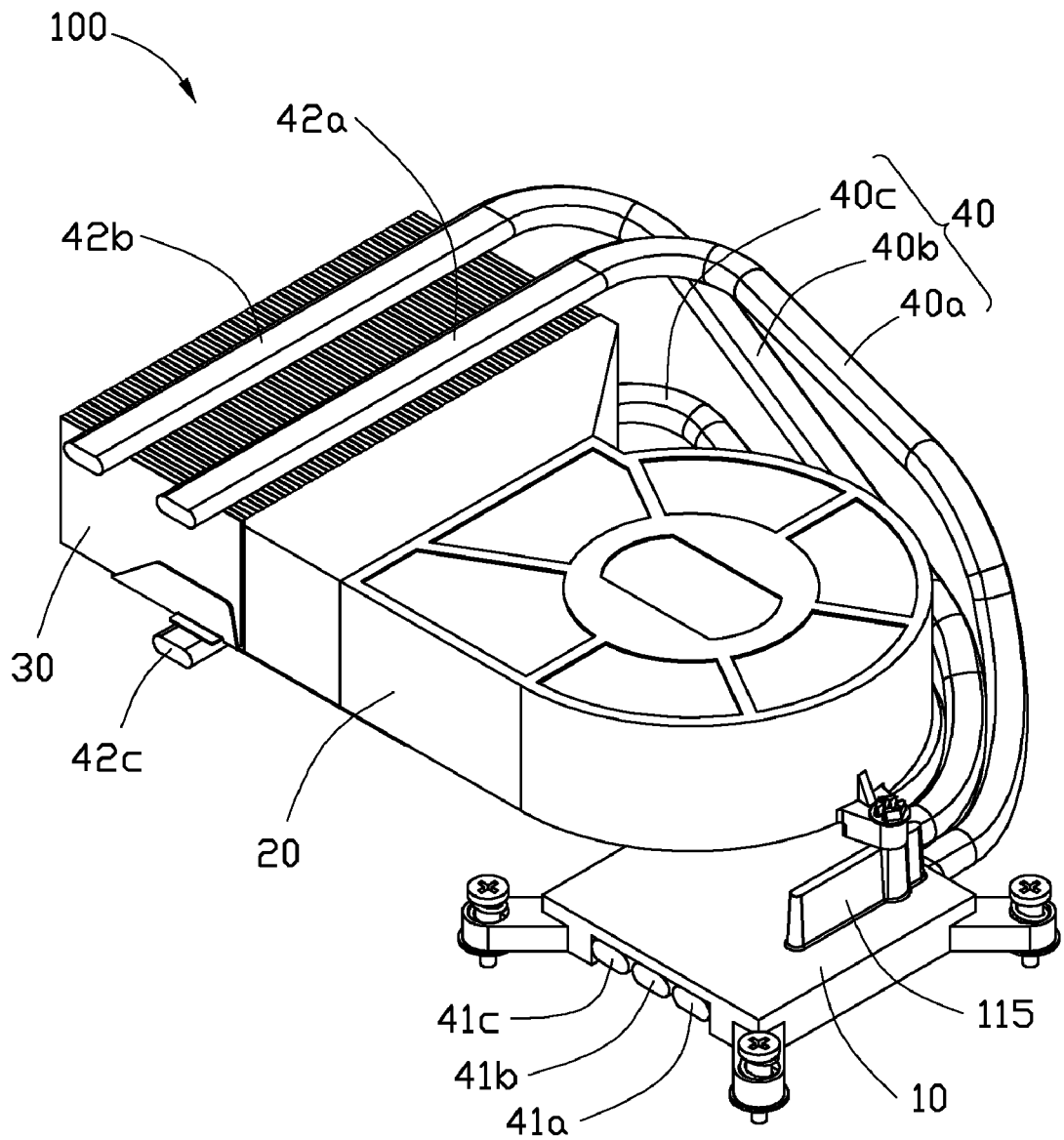
FIG. 1 is an isometric, assembled view of a thermal module, according to an exemplary embodiment of the present disclosure.
Figure 2:
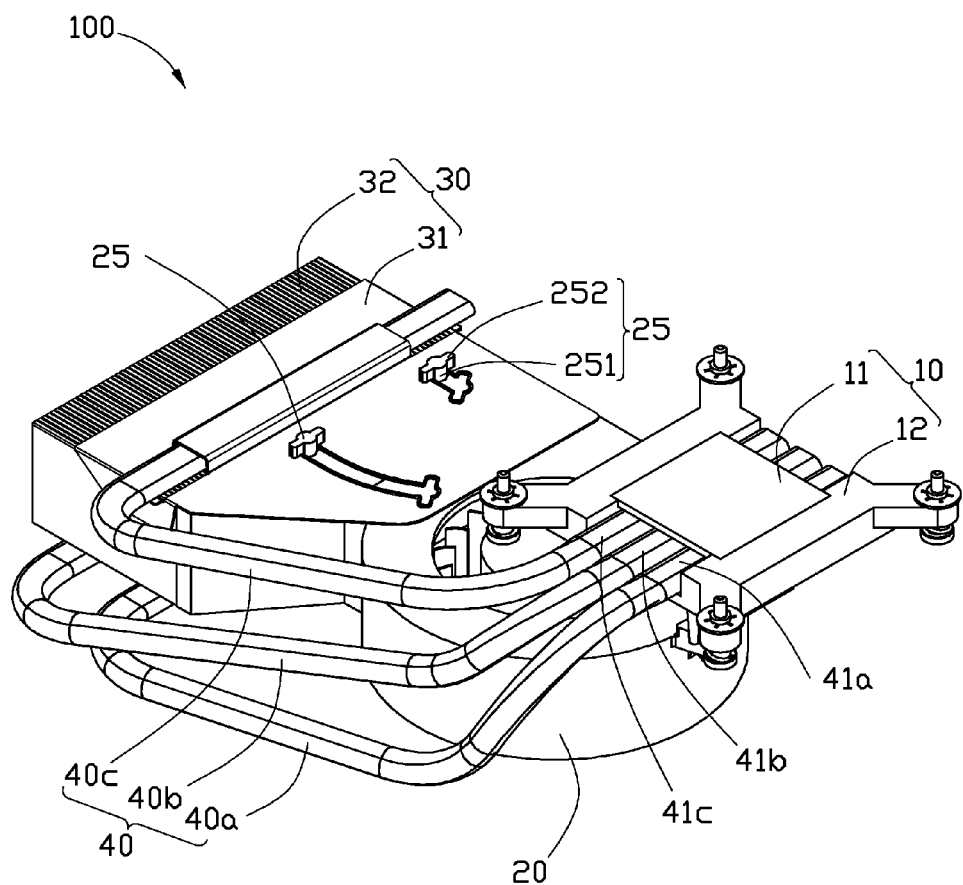
FIG. 2 is similar to FIG. 1, but showing the thermal module inverted.

Referring to FIGS. 1-2, a thermal module 100 according to an exemplary embodiment of the present disclosure is shown. The thermal module 100 includes a heat absorbing member 10, a centrifugal blower 20, a heat sink 30 and a heat conducting member 40.

Figure 3:
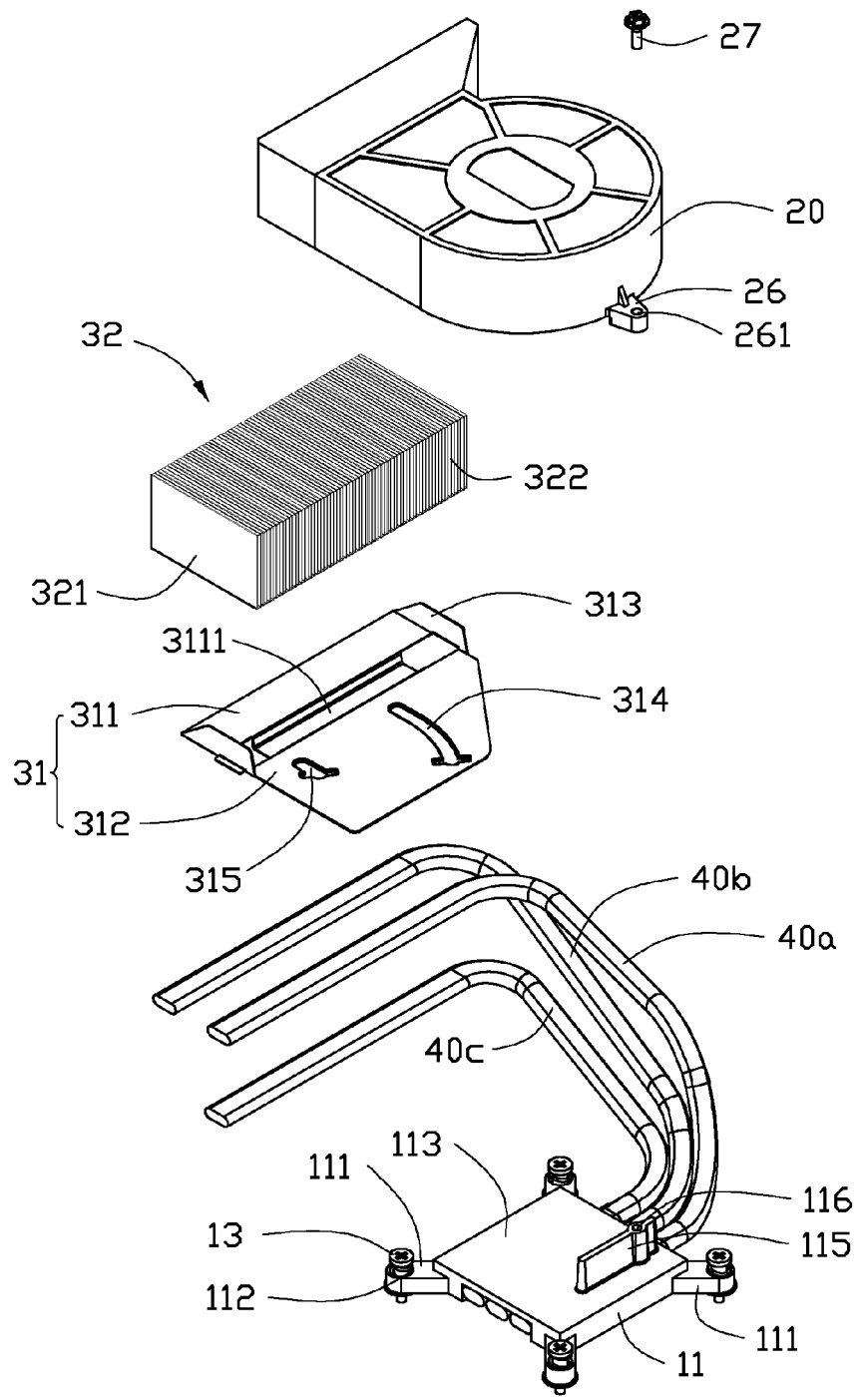
FIG. 3 is an exploded view of the thermal module shown in FIG. 1.
Figure 4:
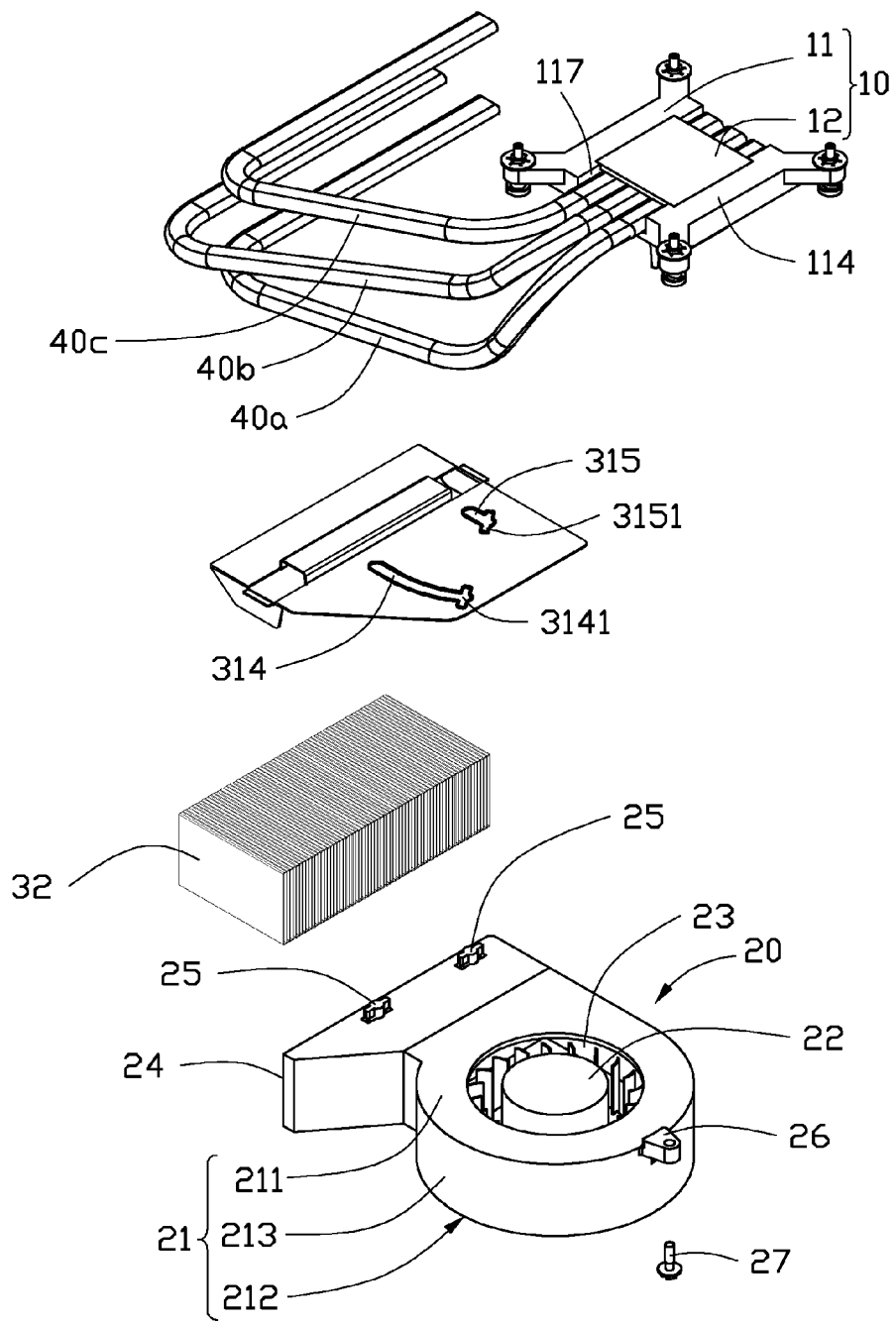
FIG. 4 is an exploded view of the thermal module shown in FIG. 2.

Referring also to FIGS. 3-4, the heat absorbing member 10 is used for thermally contacting an electronic component (not shown) for absorbing heat generated by the electronic component. The heat absorbing member 10 includes a fixing plate 11 and a heat absorbing plate 12. The fixing plate 11 is substantially rectangular and flat. The fixing plate 11 has a top surface 113 and a bottom surface 114. An elongated supporting block 115 is formed on the top surface 113 of the fixing plate 11. The supporting block 115 defines a mounting hole 116 therein adjacent to one end thereof. The fixing plate 11 defines a receiving groove 117 in the bottom surface 114 thereof. The heat absorbing plate 12 is arranged at a bottom side of the fixing plate 11, and is received in the receiving groove 117 of the fixing plate 11. Four fixing portions 111 extend outward from four corners of the fixing plate 11, respectively. A fixing hole 112 is defined in an outer end of each fixing portion 111. Four fixing member 13 such as screws are respectively inserted in the fixing holes 112 of the four fixing portions 111 for assembling of the thermal module 100 to the electronic component.

The centrifugal blower 20 includes a housing 21, and an impeller 22 rotatably received in the housing 21. The housing 21 includes a first cover 211, an opposite second cover 212, and a sidewall 213 connected between the first cover 211 and the second cover 212 (see FIG. 4). The first cover 211 axially defines an air inlet 23 therein. The sidewall 213 defines a lateral air outlet 24 therein. The first cover 211 forms two slide blocks 25 on an outer surface thereof at a position adjacent to the air outlet 24. Each slide block 25 includes a guiding portion 251 connected to the first cover 211, and an elongated latching portion 252 protruding outward from opposite sides of the guiding portion 251. A mounting ear 26 extends outward from a lateral side of the housing 21 remote from the air outlet 24. The mounting ear 26 defines a through hole 261 therein.

The heat sink 30 includes a base 31, and a fin assembly 32 disposed on the base 31. The base 31 is made of metal or metal alloy which has a high heat conductivity coefficient, such as aluminum, copper, aluminum-alloy or copper-alloy. The base 31 includes a main body 311 for arranging the fin assembly 32 thereon, and an engaging portion 312 extending horizontally from one side of the main body 311. The main body 311 of the base 31 defines an elongated receiving groove 3111 therein. Two wings 313 extend up from two opposite ends of the main body 311. The fin assembly 32 is disposed on the main body 311 of the base 31, and is sandwiched between the two wings 313. The fin assembly 32 includes a plurality of spaced fins 321 stacked along a longitudinal direction of the main body 311. A plurality of air passages 322 are formed between adjacent fins 321.

The engaging portion 312 of the base 31 defines two sliding paths 314, 315 (i.e., a first sliding path 314 and a second sliding path 315) therein, corresponding to the two slide blocks 25 of the first cover 211 of the housing 21. The two sliding paths 314, 315 are arc-shaped cutouts extending through the engaging portion 312, and are concentric. In particular, a length of the first sliding path 314 is greater than that of the second sliding path 315. The engaging portion 312 of the base 31 further defines two elongated entrances 3141, 3151 therein, for insertion of the latching portions 252 of the two slide blocks 25. The two entrances 3141, 3151 are respectively located at ends of the two sliding paths 314, 315 far from the main body 311, and respectively communicate with the two sliding paths 314, 315.

The heat conducting member 40 thermally connects the heat absorbing member 10 with the heat sink 30, for transferring heat from the heat absorbing member 10 to the fin assembly 32 of the heat sink 30. In this embodiment, the heat conducting member 40 includes three heat pipes 40a, 40b, 40c. The heat pipes 40a, 40b, 40c each includes an evaporation section 41a, 41b, 41c and a condensing section 42a, 42b, 42c respectively formed at opposite ends thereof. The evaporation sections 41a, 41b, 41c of the heat pipes 40a, 40b, 40c are received in the receiving groove 117 of the fixing plate 11, and are sandwiched between the fixing plate 11 and the heat absorbing plate 12. The fixing plate 11, the evaporation sections 41a, 41b, 41c of the heat pipes 40a, 40b, 40c, and the heat absorbing plate 12 are combined together by soldering. The condensing sections 42a, 42b of the heat pipes 40a, 40b are fixed on a top side of the fin assembly 32 (see FIG. 1). The condensing section 42c of the heat pipe 40c is received in the receiving groove 3111 of the base 31, and is attached to a bottom side of the fin assembly 32 (see FIG. 2).

Figure 5:
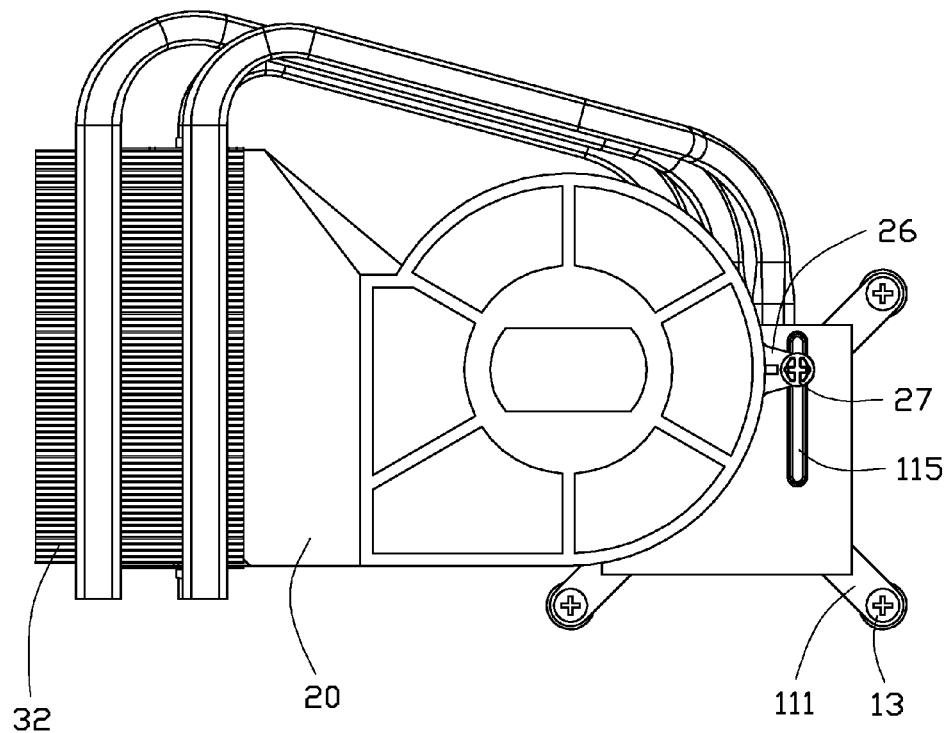
FIG. 5 is a top plan view of the thermal module shown in FIG. 1.
Figure 6:
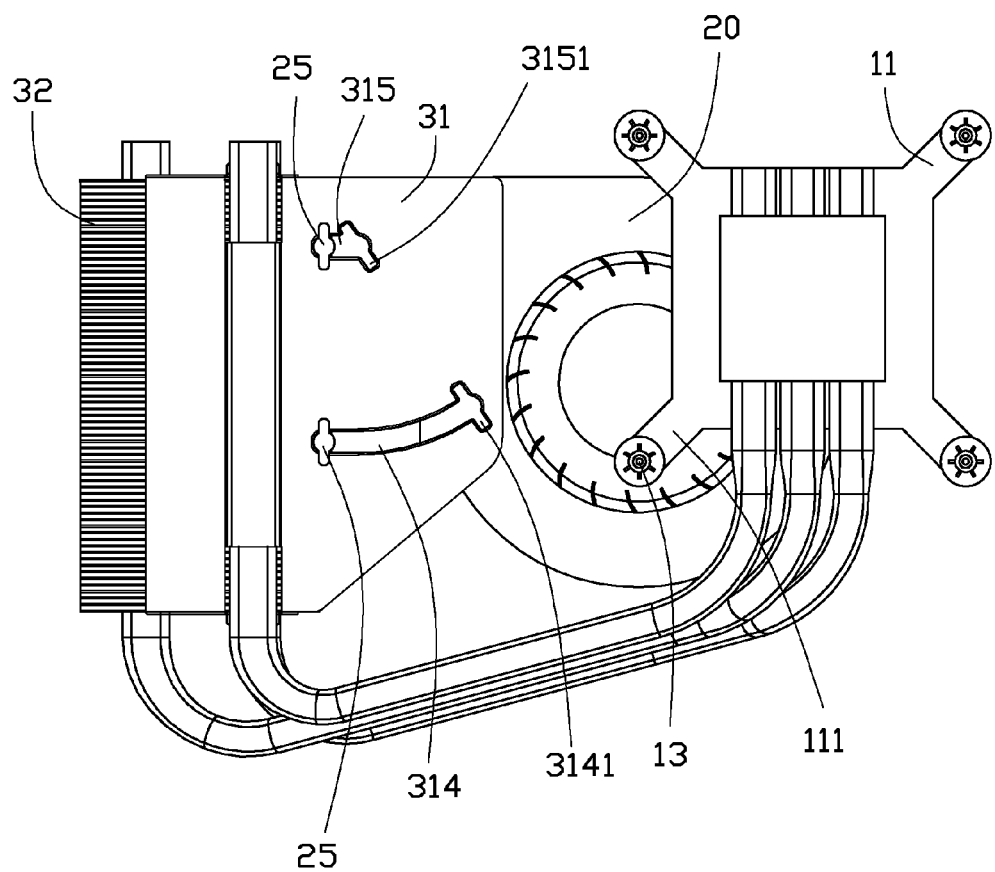
FIG. 6 is a plan view of the thermal module shown in FIG. 2.

Referring also to FIGS. 5-6, before the thermal module 100 is mounted in an electronic device, components of the thermal module 100, including the heat absorbing member 10, the centrifugal blower 20, the heat sink 30 and the heat conducting member 40, are assembled together for the purposes of packaging or transportation. The fin assembly 32 is disposed on the main body 311 of the base 31. The heat absorbing member 10 is thermally connected to the heat sink 30 via the heat pipes 40a, 40b, 40c of the heat conducting member 40. The centrifugal blower 20 is placed on the engaging portion 312 of the base 31 and the heat absorbing member 10, with the air outlet 24 of the centrifugal blower 20 facing the fin assembly 32. The mounting ear 26 is supported on the supporting block 115 of the fixing plate 11. The two slide blocks 25 of the housing 21 of the centrifugal blower 20 are respectively aligned with and inserted in the entrances 3141, 3151 of the engaging portion 312 of the base 31. Then, the housing 21 of the centrifugal blower 20 is pushed toward the fin assembly 32, causing the two slide blocks 25 of the housing 21 of the centrifugal blower 20 to move along the sliding paths 314, 315 of the engaging portion 312 of the base 31. When the two slide blocks 25 reach ends of the sliding paths 314, 315 adjacent to the fin assembly 32, the fin assembly 32 is located just at the air outlet 24 of the centrifugal blower 20. In such a state, the engaging portion 312 is sandwiched between the first cover 211 of the housing 21 and the latching portions 252 of the two slide blocks 25. The through hole 261 of the mounting ear 26 of the housing 21 is aligned with the mounting hole 116 of the supporting block 115 of the fixing plate 11. Then, a securing member 27 such as a screw is extended through the through hole 261 of the mounting ear 26 and threadedly engaged in the mounting hole 116, to detachably mount the housing 21 to the supporting block 115 of the fixing plate 11 of the heat absorbing member 10.

In the thermal module 100, after the centrifugal blower 20 has been mounted to the base 31 and the heat absorbing member 10, the fixing hole 112 of one of the four fixing portions 111, which is formed at a top-left corner of the fixing plate 11, is located under and shaded by the housing 21 of the centrifugal blower 20 (see FIGS. 5 and 6).

Figure 7:
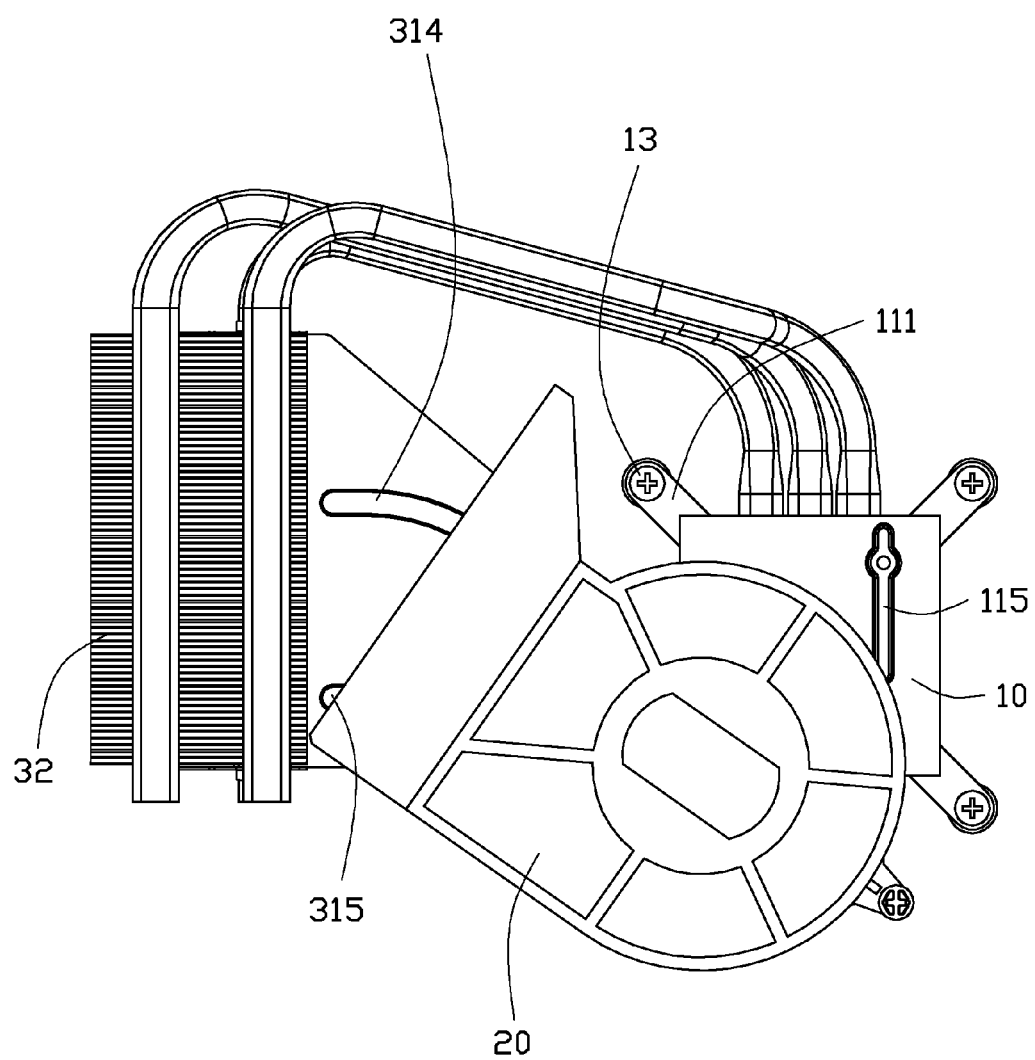
FIG. 7 is similar to FIG. 5, but showing the thermal module during assembly.
Figure 8:
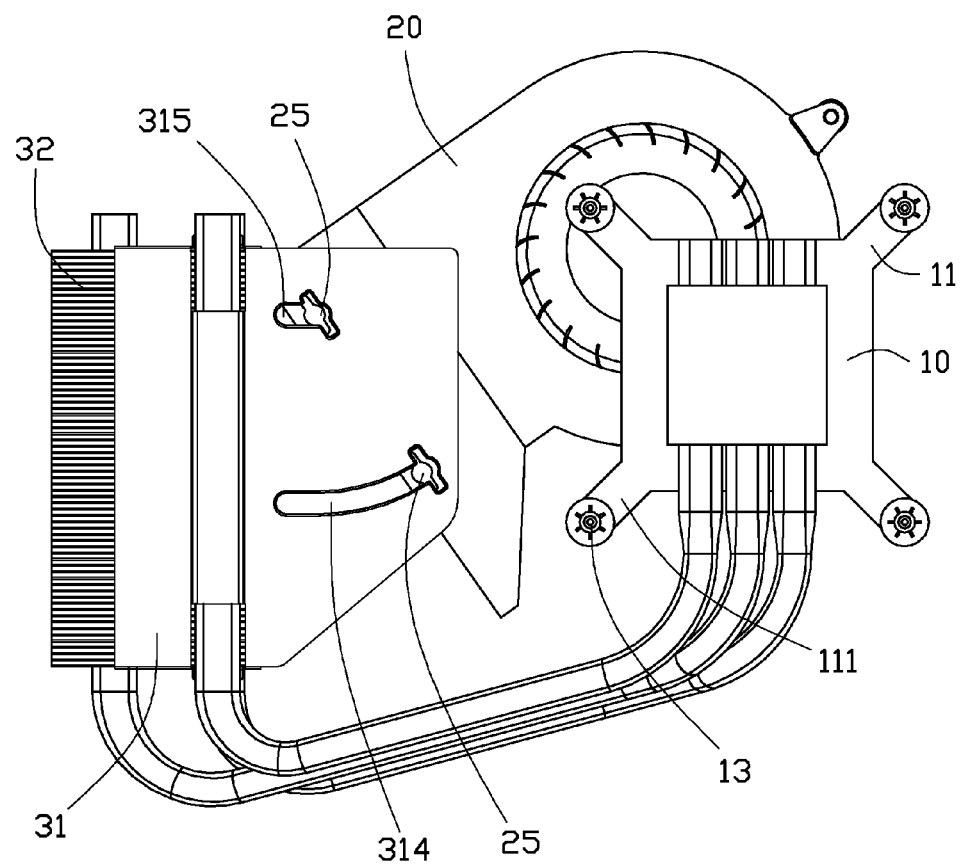
FIG. 8 is similar to FIG. 7, but showing the thermal module inverted.

Referring also to FIGS. 7-8, for assembling the thermal module 100 to the electronic component, the heat absorbing plate 12 of the heat absorbing member 10 is disposed onto the electronic component, with the fixing holes 112 of the fixing plate 11 aligned with corresponding holes of a circuit board (not shown) on which the electronic component is arranged. The fixing members 13 in the fixing holes 112 which are not shaded by the centrifugal blower 20 can be directly secured to the circuit board by a mounting tool such as a screwdriver. In order to secure the fixing member 13 which is received in the top-left fixing hole 112 shaded by the centrifugal blower 20, the securing member 27 is detached from the supporting block 115 of the fixing plate 11. Then, the centrifugal blower 20 is pushed to move toward the heat absorbing member 10, causing the two slide blocks 25 of the housing 21 of the centrifugal blower 20 to move along the sliding paths 314, 315 of the engaging portion 312 of the base 31 toward the entrances 3141, 3151, thus the centrifugal blower 20 can move away from the heat sink 30 a predetermined distance to expose the top-left fixing hole 112 which was originally shaded by the centrifugal blower 20. In such a state, the fixing member 13 inserted in the top-left fixing hole 112 can be secured to the circuit board by the mounting tool. Thus, the heat absorbing member 10 of the thermal module 100 is firmly attached to the electronic component.

After the heat absorbing member 10 has been firmly attached to the electronic component, the centrifugal blower 20 is pushed to slide toward the heat sink 30 and back to its original position. Then, the lateral side of the housing 21 is detachably mounted to the heat absorbing member 10 via the securing member 27 again, thereby mounting the centrifugal blower 20 on the base 31 and the heat absorbing member 10.

In the thermal module 100, the length of the first sliding path 314 is greater than that of the second sliding path 315. Alternatively, the first sliding path 314 can be a section of an annular cutout which has a center point located on the second sliding path 315. Thus, the slide block 25 moving along the first sliding path 314 in effect rotates relative to the second sliding path 315.

In the thermal module 100, the slide blocks 25 of the housing 21 of the centrifugal blower 20 and the sliding paths 314, 315 of the engaging portion 312 of the base 31 cooperatively function as a sliding mechanism to allow the centrifugal blower 20 to be slidable relative to the base 31. When the thermal module 100 is mounted to the electronic component, the centrifugal blower 20 need not be detached from the thermal module 100. Thus, the mounting process of the thermal module 100 is convenient. Furthermore, in alternative embodiments, the arrangements of the slide blocks 25 and the sliding paths 314, 315 can be exchanged. That is, the slide blocks 25 can be formed on the engaging portion 312 of the base 31, and the sliding paths 314, 315 can be defined in the housing 21 of the centrifugal blower 20.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A thermal module, comprising:
a heat absorbing member comprising a plurality of fixing portions for fixing the thermal module in position relative to a heat-generating body;
a heat sink comprising a base, a fin assembly disposed on the base, and an engaging portion extending from one side of the base;
a heat conducting member connecting the heat absorbing member with the heat sink; and
a centrifugal blower comprising a housing and an impeller rotatably received in the housing, the housing defining a lateral air outlet therein, the housing being placed on the engaging portion of the heat sink and the heat absorbing member with the air outlet thereof facing the fin assembly, the engaging portion engaging with the housing of the centrifugal blower, at least one of the fixing portions of heat absorbing member being located under and shaded by the housing of the centrifugal blower;

wherein the housing of the centrifugal blower and the engaging portion of the base cooperatively provide a sliding mechanism to allow the centrifugal blower to be slidable relative to the base.

2. The thermal module of claim 1, wherein sliding mechanism comprises at least one slide block and at least one sliding path, the at least one slide block being formed on one of the housing of the centrifugal blower and the engaging portion of the base, the at least one sliding path being defined in the other one of the housing of the centrifugal blower and the engaging portion of the base, the at least one slide block being received in the at least one sliding path, the housing of the centrifugal blower engaging with the engaging portion via the at least one slide block.

3. The thermal module of claim 2, wherein the housing comprises a first cover facing the engaging portion of the base, an opposite second cover, and a sidewall connected between the first and second covers, the slide block is formed on an outer surface of the first cover of the housing, and the sliding path is defined in the engaging portion of the base.

4. The thermal module of claim 3, wherein the at least one slide block comprises a guiding portion connected to the first cover and a latching portion formed on a free end of the guiding portion, the at least one sliding path being a cutout extending through the engaging portion, the guiding portion extending through the cutout, the engaging portion of the heat sink being sandwiched between the first cover of the housing and the latching portion of the slide block.

5. The thermal module of claim 2, wherein the at least one sliding path is arc-shaped.

6. The thermal module of claim 2, wherein the at least one slide block comprises a guiding portion inserted in the at least one sliding path, and a latching portion formed on a free end of the guiding portion extending through the at least one sliding path.

7. The thermal module of claim 1, wherein a lateral side of the housing remote from the air outlet of the centrifugal blower is detachably mounted to the heat absorbing member.

8. The thermal module of claim 7, wherein, the housing forms a mounting ear on the lateral side thereof, the heat absorbing member forming an elongated supporting block thereon, the mounting ear being mounted to and supported on the supporting block.

9. The thermal module of claim 1, wherein the heat conducting member comprises at least one heat pipe.

10. The thermal module of claim 1, wherein sliding mechanism comprises two slide blocks and two corresponding sliding paths, the two slide blocks being formed on one of the housing of the centrifugal blower and the engaging portion of the base, the two sliding paths being defined in the other one of the housing of the centrifugal blower and the engaging portion of the base, the two slide blocks being respectively received in the two sliding paths, the housing of the centrifugal blower engaged with the engaging portion via the two slide blocks.

11. The thermal module of claim 10, wherein the two slide blocks are formed on the housing, and the two sliding paths are defined in the engaging portion of the base and are concentric.

12. The thermal module of claim 10, wherein a length of one of the two sliding paths is greater than that of the other one of the two sliding paths.

13. The thermal module of claim 10, wherein one of the two sliding paths is a section of an annular cutout, and a center point of the annular cutout is located on the other one of the two sliding paths.

14. A thermal module for dissipating heat of an electronic component, the thermal module comprising:
    a heat absorbing member comprising a heat absorbing plate adapted for contacting the electronic component and a plurality of fixing portions around the heat absorbing plate for fixing the heat absorbing plate to the electronic component;
    a heat sink comprising a base, a fin assembly disposed on the base, and an engaging portion extending from one side of the base;
    a heat conducting member connecting the heat absorbing member with the heat sink; and
    a centrifugal blower comprising a housing and an impeller rotatably received in the housing, the housing defining a lateral air outlet therein, the housing being placed on the engaging portion of the heat sink and the heat absorbing member with the air outlet thereof facing the fin assembly, the engaging portion engaging with the housing of the centrifugal blower, one lateral side of the housing remote from the air outlet of the centrifugal blower being detachably mounted to the heat absorbing member, at least one of the fixing portions of heat absorbing member being located under and shaded by the housing of the centrifugal blower;
    wherein the housing of the centrifugal blower and the engaging portion of the base cooperatively provide a sliding mechanism to allow the centrifugal blower to be slidable relative to the base in a plane parallel to the engaging portion after the lateral side of the housing is detached from the heat absorbing member.

15. The thermal module of claim 14, wherein sliding mechanism comprises two slide blocks and two sliding paths, the two slide blocks being formed on one of the housing of the centrifugal blower and the engaging portion of the base, the two sliding paths being defined in the other one of the housing of the centrifugal blower and the engaging portion of the base, the two slide blocks being received in the two sliding paths, the housing of the centrifugal blower engaging with the engaging portion via the two slide blocks.

16. The thermal module of claim 14, wherein the housing comprises a first cover facing the engaging portion of the base, an opposite second cover, and a sidewall connected between the first and second covers, the two slide blocks are formed on an outer surface of the first cover of the housing, and the two sliding paths are defined in the engaging portion of the base.

17. The thermal module of claim 16, wherein the two sliding paths are arc-shaped cutouts extending through the engaging portion, and are concentric.

18. The thermal module of claim 17, wherein a length of one of the two sliding paths is greater than that of the other one of the two sliding paths.

19. The thermal module of claim 14, wherein the housing forms a mounting ear on the lateral side thereof remote from the air outlet, the mounting ear detachably mounted on the heat absorbing member via a securing member.

20. The thermal module of claim 19, wherein the heat absorbing member forms an elongated supporting block thereon, the mounting ear being supported on the supporting block.

* * * * *